July 9, 1963 G. C. SZIKLAI ETAL 3,097,336
SEMICONDUCTOR VOLTAGE DIVIDER DEVICES
Filed May 2, 1960

WITNESSES
John C. Healy, Jr.
Gordon H. Telfer

INVENTORS
George C. Sziklai &
Gene Strull
BY
Charles F. Renz
ATTORNEY

United States Patent Office 3,097,336

Patented July 9, 1963

3,097,336

SEMICONDUCTOR VOLTAGE DIVIDER DEVICES

George C. Sziklai, Rosslyn Farms, Pa., and Gene Strull, Pikesville, Md., assignors to Westinghouse Electric Corporation, East Pittsburgh, Pa., a corporation of Pennsylvania Filed May 2, 1960, Ser. No. 25,982
12 Claims. (Cl. 323—94)

Figure 1:
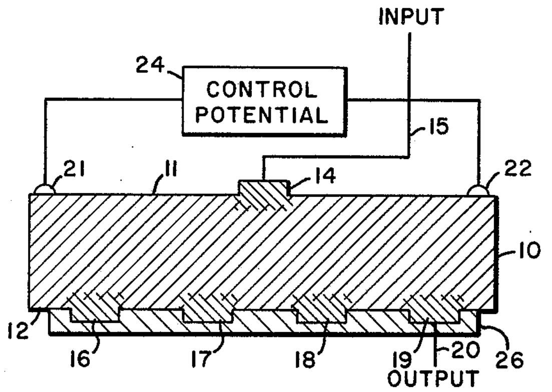

This invention relates generally to semiconductor devices and more particularly to such devices wherein minority carrier deflection is employed between two or more regions of a semiconductor body.

The electrical and electronic arts have long employed as voltage dividers and variable resistors devices such as slide-wire rheostats and similar devices which employ a resistive element and a movable contact which is mechanically set to the position providing the desired resistance. Assuming that such a device is made ideally and has uniform resistivity throughout so that resistance may be varied continuously and smoothly, the life of the instrument is still limited by the fact that mechanical contact is necessary to its operation and therefore wear of the contacts is incurred. Therefore, such devices exhibit an inherently high degree of unreliability.

It is also the case that mechanical variable resistors or the like are not readily adaptable to provide any of a large variety of resistive patterns which may be desired.

It is, therefore, an object of the present invention to provide a semiconductor device for use as a circuit element having a continuously variable resistance.

Another object of this invention is to provide a variable resistor having no mechanical contacts or other parts subject to wear.

Another object of this invention is to provide an improved variable resistance device of low bulk volume and easy fabrication.

Another object is to provide a unitary solid state device which multiplies two voltages or signals over a wide frequency range.

Another object is to provide a unitary solid state function generator which acts to create a function of an applied signal.

According to the present invention, a semiconductor element comprising a body of semiconductor material is provided having an emitter and a plurality of collectors or a single continuous collector having a junction with the base material much larger than the emitter junction. Minority carriers injected at the emitter junction are deflected to a particular collector region as determined by a transverse electric field through the base region between the emitter and the collectors. The transverse electric field through the base is a variable field. One of the collectors, or a region of the continuous collector, has an electrode serving as the output electrode of the device, the potential of which is determined by the length of path between it and the collector at which most of the carriers are collected and by the resistivity of that path. According to other features of the invention, variable resistance devices and voltage dividers or potentiometers are provided.

Figure 2:
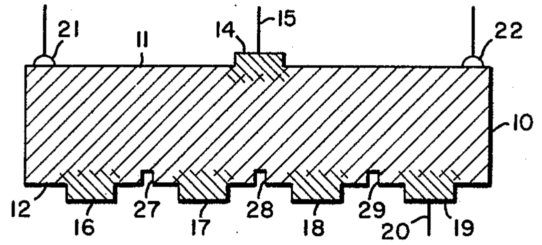
Figure 3:
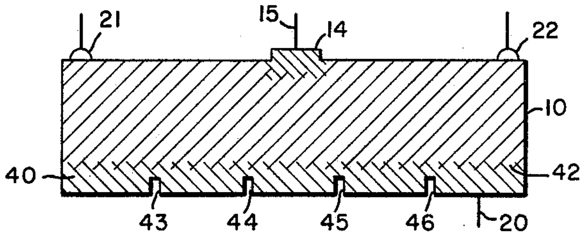
Figure 4:
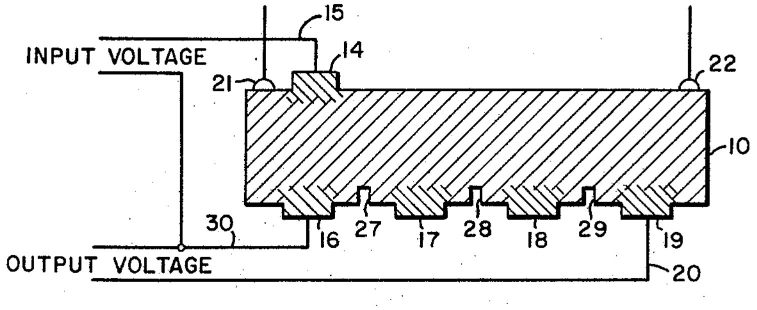

The features of the present invention which are believed to be novel are set forth with particularity in the appended claims. The present invention, both as to its organization and manner of operation, together with the above-mentioned and further objects and advantages thereof, may best be understood by reference to the following description, taken in conjunction with the accompanying drawings, in which:

FIGURE 1 is a sectional view of a device according to one embodiment of the present invention; and FIGS. 2, 3 and 4 are sectional views of devices in accordance with alternative embodiments of the present invention.

Referring now to FIG. 1, there is shown a variable resistance device comprising a semiconductor body 10 having opposing surfaces 11 and 12. On a first surface 11 there is disposed a rectifying contact or emitter region 14 comprising semiconductive material of opposite conductivity type to that of the base region or bulk of the semiconductor body 10. On the opposite surface 12 there are disposed a plurality of rectifying contacts or collector regions 16, 17, 18 and 19 which are also of semiconductive material of opposite conductivity type to that of the semiconductor body 10. At opposite ends of the semiconductor body 10 there are disposed ohmic contacts 21 and 22 which will be referred to as the base electrodes.

The device of FIG. 1 has an input at the emitter 14 and an output at the collector 19 which is at the end of the series of collectors 16–19. A suitable circuit means 15 is provided in electrical contact with the emitter 14 in order that injection of minority carriers may occur at the junction between the emitter 14 and the base 10. The output signal from the collector 19 of the device may be employed in any suitable circuit to which the lead 20 may be connected. A variable control potential is applied across the base electrodes 21 and 22 by a suitable control potential source 24.

It may be desirable for a particular purpose to alter the resistance of the path between the collectors 16, 17, 18 and 19. For example, if the path between the collectors 16, 17, 18 and 19 is of too high resistance, the resistance may be reduced by imposing on the surface 12 of the device having the collectors 16, 17, 18 and 19 a coating of material 26 having a desired resistivity for the intended use of the device.

FIG. 2 shows an alternative method of providing a suitable conductive and resistance path between the collectors 16, 17, 18 and 19. Suitable etchings 27, 28 and 29 are made between the collectors 16, 17, 18 and 19 to increase the path length between adjacent collectors and thereby increase the resistance to a higher level. In this manner the close spacing of the collectors 16, 17, 18 and 19 is preserved resulting in a compact device and yet suitable resistivity is attained. The pattern of the etching is, of course, not critical and may take any desired form.

In the embodiment shown in FIG. 3, a continuous collector 40 is located on the base member 10. The continuous collector 40 forms a rectifying junction 42 across the entire face of the device opposite the emitter 14. Etched grooves 43, 44, 45 and 46 are shown extending into the collector region 40 but not penetrating through the rectifying junction 42. Alternatively, the etched grooves may extend through the rectifying junction 42 and separate the region 40 into a plurality of individual collectors. In the latter instances, the resistance of the path between the various collectors would be substantially greater than the resistance of the path through the continuous collector 40, as shown in FIG. 3.

As employed herein and in the appended claims, the term "collector region" is used to designate a portion or elemental area of material, opposite in conductivity type to that of the base material, to which carriers emitted at the emitter are collected after traversing the base material. A collector region, therefore, need not, in accordance with this invention, be physically separated from the remaining collector regions of the device. Therefore, while FIGS. 1 and 2 show distinct collector regions 16, 17, 18 and 19, the device of FIG. 3 employs a continuous collector portion 40 which, because of its substantial area, necessarily includes a plurality of collector regions which may or may not be partially or fully separated by etched grooves.

In operation, referring to either FIGS. 1 or 2, positive charge carriers or holes in a p-n-p type device or electrons in an n-p-n device are injected into the base material 10 at the junction of the base material 10 with the emitter 14. Unless influenced by a separately applied electric field, the carriers generally diffuse and follow random paths throughout the base 10. Those carriers which reach one of the collector regions 16, 17, 18 and 19 before absorption occurs effectively provide current carriers in an external circuit 20. Therefore, it is seen that, absent any applied field most carriers injected at the emitter 14 will ordinarily be collected by the closest collector, or would be divided substantially equally between collectors equally spaced from the emitter 14. The application of a potential difference between the base electrodes 21 and 22 by means of the control potential source 24 establishes an electric field transversely to the paths the carriers follow between the emitter 14 and the collectors 16, 17, 18 and 19. Depending on the polarity of the field, the carriers will be deflected to the right or to the left of their normal path. The magnitude of the field determines the extent of deflection. The emitter and each of the collectors must, of course, be so spaced that there is no substantial absorption of carriers before collection.

Therefore, it can be seen that a path having a higher total resistance is taken by current carriers which travel from the emitter 14 to the first collector 16 and then over the surface 12 to the output 19 compared with those which travel directly from the emitter 14 to the last collector 19. In the former case, the resistive path length between the collectors 16 and 19 is interposed into the circuit. On the other hand, when carriers travel from the emitter 14 to the output collector 19, the resistance inserted into the circuit is much less.

The operation of the device shown in FIG. 3 is substantially like that of the devices of FIGS. 1 and 2. Carriers from the emitter 14 are deflected to a particular collector region of the continuous collector 40 depending upon the magnitude and direction of the control potential applied across the base electrodes 21 and 22. The carriers then traverse the continuous collector region to an output electrode 20 applied at one end of the continuous collector 40.

The devices shown in FIGS. 1, 2 and 3 are fully effective as variable resistors only when a control potential applied to the contacts 21 and 22 can be switched in polarity so as to be able to deflect carriers both to the right and to the left. An alternative embodiment and one which is preferred in some applications in order to avoid the necessity of a bi-polar control potential, comprises a device as shown in FIGS. 1, 2 or 3 but with the emitter 14 moved to a position at an extremity of the device, for example, opposite the first collector 16, as shown in FIG. 4. Therefore, in the absence of any control potential the collector 16 will receive most of the carriers. The control potential need be variable in only one direction to achieve deflection to the other collectors 17, 18 and 19 so as to reduce the resistive path length interposed into a circuit by the device. Of course, if desired, the emitter could be disposed opposite the output collector 19. In that case, the resistance interposed into a circuit by the device would increase in direct relation to the magnitude of the applied control potential.

As above discussed and described, the semi-conductor device of FIGS. 1, 2 and 3 is employed as a variable resistance circuit element but may be readily converted into a voltage divider, multiplier or potentiometer by the application of a contact to the first collector 16, or a corresponding portion of the continuous collector region 40 of FIG. 3, which may serve as the common point of the divider. That is, the voltage applied between the input terminal 14 and the common terminal 16 would be divided in accordance with the applied control potential supplied by the source 24 and an equal or lesser voltage be obtained between the output terminal 19 and the common terminal 16.

In use as a potentiometer, a standard cell or source of D.C. voltage would be applied across the emitter 14 and the common terminal 16 while an unknown source of potential would be applied across the collector 20 and the common terminal 16 in series with a galvanometer or other suitable current indicating device. The amount of control potential applied across the base electrodes 21 and 22 would, by proper calibration, indicate the resistance across which the unknown cell is applied which results in the indication of zero current. The magnitude of the electromotive force supplied by the unknown cell may thus be determined in accordance with well known practices employed with conventional potentiometers.

FIG. 4 shows the last two modifications which have been referred to. Of course, they may each be employed separately. The emitter 14 has been disposed at the end of the device opposite the collector 16. In addition, a potentiometer or voltage divider configuration has been achieved by providing a common lead 30 from the first collector 16. Voltage division is achieved by applying input voltage across terminals 14 and 16 and deriving the output voltage from terminals 16 and 19.

A variety of methods will suggest themselves to those skilled in the art as suitable means for the fabrication of a device in accordance with the present invention. For example, the semiconductor body 10 may be a wafer of single crystal silicon doped with a p-type doping material such as boron, gallium or aluminum prepared in accordance with techniques well known to those skilled in the art. The emitter region 14 and the collector regions 16, 17, 18 and 19, or a continuous collector 40, may be applied by well known alloying or vapor diffusion techniques. In the case in which the semiconductor body 10 is of p-type silicon, the emitter and collector regions are made of n-type material by introducing suitable impurities such as arsenic, antimony or phosphorus for this purpose. In the case in which alloying techniques are used, the doping impurity may be admixed with a neutral material such as gold or lead, deposited in a suitable pattern on the semiconductor body which is then heated to melt the alloy to cause it to go into solution with the semiconductor material.

The entire surface 12 of the body 10 may be formed with a collector region thereon, parts of which may be subsequently removed by etching to provide individual collector regions or a continuous region with etched grooves extending only part of the way through. Alternatively, individual collector regions may be formed initially.

The semiconductor body 10 may also be formed in accordance with the teachings of copending application Serial No. 844,288 entitled "Process for Producing Crystals and the Products Thereof," by A. I. Bennett, Jr., filed October 5, 1959, now Patent 3,031,403, and assigned to the same assignee as the present invention. This application teaches methods for formation of semiconductor dendrites from which a portion may be cut for use in the present device. Emitter and collector regions may be formed on such a semiconductor body in accordance with the teachings of copending application Serial No. 807,570 entitled "Continuous Process for Producing Semiconductor Devices," by Longini, Bennett and John, filed April 20, 1959, and assigned to the same assignee as the present invention.

The coating 26 shown in FIG. 1 may be of a suitable neutral material such as silver, gold or tin deposited over the collector regions 16, 17, 18 and 19 as well as directly on the surface 12 of the semiconductor body 10. It will also be possible to employ a layer which is in contact only with the collector regions and not in contact with the base member 10. Such a layer may be of a similar neutral metal or of an n-type alloy which may be bonded to the collector regions.

A typical device in accordance with this invention may have any number of collectors and is not limited within a narrow size range. A typical device, for example, may have five collector regions spaced apart by etched grooves about one-half mil across. The total length of the device may be of about 50 mils. The magnitude of the input voltage applied at the emitter is of about 25 volts and the variable control potential may be from about zero to 50 volts.

It will be noted by those skilled in the art that a number of factors may be varied in accordance with the present invention. For example, the number and spacing of collectors can be varied over relatively wide limits and furthermore, need not be uniform. That is, in any particular device the distances between adjacent collectors need not, if desired, be the same. It is also possible to utilize a device in accordance with the present invention having more than one emitter electrode. The geometry of the device could be one of many forms other than that shown in the figures.

The etching or coating used between collectors to increase the resistance also need not be uniform, but may be varied in order that the resistance or voltage drop of the device vary in accordance with a particular function of input control potential which need not necessarily be linear. Moreover, a wide variety of semiconductor materials may be selected having varying quantities of doping impurities therein to bring about semiconductor bodies of different resistivities making them more suitable for particular purposes.

For the foregoing reasons, it will be apparent to those skilled in the art that many different devices may be made in accordance with the present invention which are useful in a variety of applications. Generally, the devices described may be used to provide an output signal which is a particular function of the input signal determined by the applied deflecting field and the nature of the path the charge carriers take.

Further variation over the impedance of the path between collectors may be achieved by illuminating this path by a suitable light source of controlled brightness. The conductivity of most semiconductor materials increases under photon bombardment. A suitable light source for use in this manner would be an electroluminescent cell across which a suitable electric field is applied. It is known that upon increased applied potential higher brightness is generally derived from such a cell with a resulting increase in the conductivity of the illuminated semiconductor material.

It will be noted that a variable resistance device or voltage divider in accordance with the present invention may employ a plurality of collector electrodes in a very small space and thereby give a continuously variable resistance varying only by small increments between adjacent collectors. This is made possible by reason of the fact that conductive leads need not be applied to each of the collector regions, but only to those at the ends to which it is possible to make contact readily.

While the present invention has been shown in only a few forms, it will be obvious to those skilled in the art that it is not so limited but is susceptible of various changes and modifications without departing from the spirit and scope thereof.

We claim as our invention:

1. A semiconductor device comprising a body of semiconductive material having a base, an emitter and a collector portion, said collector portion comprising a plurality of collector regions defining a plurality of current carrier paths between said emitter and each of said plurality of collector regions, means to establish an electric field transverse to said plurality of current paths to deflect current carriers in accordance with the magnitude and direction of said electric field, circuit means electrically coupled to at least one and less than all of said plurality of collector regions to derive an electrical output signal the magnitude of which is determined by the resistive path taken by current carriers between the collector region to which said current carriers are deflected by said electric field and the collector region having said circuit means electrically coupled thereto.

2. A semiconductor device comprising a body of semiconductive material having a plurality of rectifying contacts thereon defining a plurality of current carrier paths between one of said rectifying contacts and each of the remainder of said rectifying contacts, deflecting means to deflect current carriers between said plurality of current carrier paths in accordance with an applied control signal, circuit means electrically coupled to at least one and less than all of said plurality of rectifying contacts to derive an electrical output signal the magnitude of which is determined by the resistance of the path taken by current carriers between the rectifying contact to which said deflecting means deflects them and the rectifying contact having said circuit means coupled thereto.

3. A semiconductor device comprising a body of semiconductive material having an emitter and a plurality of collectors opposing said emitter and defining a plurality of current carrier paths therebetween, means to establish an electric field transverse to said plurality of current carrier paths to deflect current carriers between said plurality of current carrier paths in accordance with the magnitude and dircetion of said electric field, circuit means electrically coupled to at least one and less than all of said plurality of collectors to derive an electrical output signal the magnitude of which is determined by the resistive path taken by current carriers between the collector to which said current carriers are deflected by said electric field and the collector having said circuit means electrically coupled thereto.

4. A semiconductor device comprising a body of semiconductive material having a pair of opposing surfaces, an emitter region disposed on one of said pair of opposing surfaces and a plurality of collector regions disposed on the other of said pair of opposing surfaces to define a plurality of current carrier paths between said emitter region and each of said plurality of collector regions, means to establish an electric field transverse to said plurality of current carrier paths to deflect current carriers to one of said collector electrodes in accordance with the magnitude and direction of said electric field, circuit means electrically coupled to at least one and less than all of said collector regions to derive an electrical output signal the magnitude of which is determined by the resistive path taken by current carriers between the collector region to which said current carriers are deflected and the collector region to which said circuit means is electrically coupled.

5. A semiconductor device comprising a body of semiconductive material having a pair of opposing surfaces, an emitter region disposed on one of said surfaces having means electrically coupled thereto to cause emission of minority current carriers into said body of semiconductive material, a plurality of collector regions disposed on the other of said pair of opposing surfaces and defining a plurality of current carrier paths between said emitter region and each of said collector regions, means including a control potential source coupled to a pair of ohmic contacts on said body of semiconductive material to establish an electric field transverse to said plurality of current carrier paths to deflect current carriers between said plurality of collector regions in accordance with the magnitude and direction of said electric field, circuit means electrically coupled to at least one and less than all of said plurality of collector regions to derive an electrical output signal the magnitude of which is determined by the resistive path taken by carriers between that collector to which they are deflected and that collector to which said circuit means is electrically coupled.

6. A semiconductor device comprising a body of semiconductive material having a pair of opposing surfaces, an emitter region disposed on one of said opposing surfaces and having means electrically coupled thereto to cause the emission of minority charged carriers into said body of semiconductive material, a plurality of collector regions disposed on the other of said opposing surfaces thereby defining a plurality of current carrier paths between said emitter region and each of said plurality of collector regions, means to establish a conductive path having substantial resistance between said plurality of collector regions in series relationship, means including a control potential source and a pair of ohmic contacts disposed on said body of semiconductive material to establish an electric field transverse to said plurality of current carrier paths to deflect current carriers between said plurality of collector regions in accordance with the magnitude and direction of said electric field, circuit means electrically coupled to at least one and less than all of said plurality of collector regions to derive an electrical output signal the magnitude of which is determined by the resistive path length taken by current carriers between that collector region at which they are collected and that collector region to which said circuit means is electrically coupled.

7. A semiconductor device comprising a body of semiconductive material having a pair of opposing surfaces, an emitter region disposed on one of said opposing surfaces and having means electrically coupled thereto to cause the emission of minority charged carriers into said body of semiconductive material, a plurality of collector regions disposed on the other of said opposing surfaces to define a plurality of current carrier paths between said emitter region and each of said plurality of collector regions, means to establish a conductive path having substantial resistance between said plurality of collector regions in series relationship, means including a pair of ohmic contacts disposed on said body of semiconductive material and a control potential source to establish an electric field transverse to said plurality of current carrier paths to deflect current carriers between said plurality of collector regions in accordance with the magnitude and direction of said electric field, output circuit means electrically coupled to at least one and less than all of said plurality of collector regions to derive an electrical output signal the magnitude of which is determined by the resistive path length taken by current carriers between that collector region at which they are collected and that collector region to which said circuit means is electrically coupled, circuit means electrically coupled to the one of said collector regions remote in said series relationship from the collector to which said output circuit means is coupled and serving as a common electrode, a voltage source applied across said emitter region and said common electrode the voltage of which is reduced in accordance with said control potential and derived from said output electrode and said common electrode.

8. A semiconductor device capable of being operated as a voltage divider, multiplier or potentiometer having no moving parts, said device comprising: a bulk semiconductor material of a first type of semiconductivity and a plurality of regions of a second type of semiconductivity on said bulk material; first contact means on said body; second contact means on at least two and less than all of said plurality of regions so that a first of said regions may be operated as an emitter of minority carriers into said bulk material which carriers will travel to and be collected by another of said regions as determined by potential applied to said first contact means and will travel a resistive path between the collecting region and another region having contact means thus altering the potential drop in the device.

9. A semiconductor device for use as a voltage divider or multiplier having no moving parts, said device comprising: a body of semiconductive material of a first type of semiconductivity and a plurality of regions of a second type of semiconductivity on said body; first contact means on said body; second contact means on at least two and less than all of said plurality of regions; means to apply a control potential to said first contact means; means to apply an input voltage to one of said second contact means; means to derive an output voltage from another of said second contact means which output voltage varies in accordance with said control potential as well as said input voltage due to the resistance imposed in the current carrier path between the region at which carriers are collected and the region from which the output voltage is derived.

10. A semiconductor device for use as a potentiometer having no moving parts, said device comprising: a body of semiconductive material of a first type of semiconductivity and a plurality of regions of a second type of semiconductivity on said body; first contact means on said body; second contact means on at least two and less than all of said plurality of regions; means to apply a known voltage between a first of said second contact means and a point of reference potential; means to apply an unknown voltage between another of said second contact means and said point of reference potential; means to apply a variable control potential to said first contact means which for a predetermined output current indicates a resistance across which the unknown voltage is applied and thus permits the determination of the unknown voltage.

11. A semiconductor device capable of being operated as a variable resistor having no moving parts, said device comprising: a bulk semiconductive material of a first type of semiconductivity and a plurality of physically separate regions of a second type of semiconductivity on said bulk material; first contact means on said body; second contact means on at least two and less than all of said plurality of physically separate regions so that a first of said regions may be operated as an emitter of minority carriers into said bulk material which carriers will travel to and be collected by another of said regions as determined by the potential applied to said first contact means and the resistance of the current path between the collecting region and another region having contact means thus controlling the potential drop in the device.

12. A semiconductor device capable of being operated as a variable resistor having no moving parts, said device comprising: a bulk semiconductive material of a first type of semiconductivity and first and second regions of a second type of semiconductivity on said bulk material; first contact means on said body; second contact means on said first region and on one part of said second region disposed in a position having considerable variation in distance to other parts of said second region so that the first of said regions may be operated as an emitter of minority carriers into said body which carriers will travel to and be collected by a part of said second region as determined by potential applied to said first contact means and the resistive path between the collecting part of the second region and the other part of the second region having the contact means will be imposed in the circuit and thus alter the potential drop in the device.

References Cited in the file of this patent

UNITED STATES PATENTS

| | | |
|---|---|---|
| 2,801,348 | Pankove | July 30, 1957 |
| 2,901,554 | Lesk | Aug. 25, 1959 |